(12) United States Patent
Qian et al.

(10) Patent No.: US 8,598,678 B2
(45) Date of Patent: Dec. 3, 2013

(54) PARASITIC VERTICAL PNP BIPOLAR TRANSISTOR AND ITS FABRICATION METHOD IN BICMOS PROCESS

(75) Inventors: Wensheng Qian, Shanghai (CN); Jun Hu, Shanghai (CN); Donghua Liu, Shanghai (CN)

(73) Assignee: Shanghai Hua Hong Nec Electronics Company, Limited, Shanghai (CN)

( * ) Notice: Subject to any disclaimer, the term of this patent is extended or adjusted under 35 U.S.C. 154(b) by 363 days.

(21) Appl. No.: 12/963,242

(22) Filed: Dec. 8, 2010

(65) Prior Publication Data
US 2011/0140233 A1 Jun. 16, 2011

(30) Foreign Application Priority Data
Dec. 15, 2009 (CN) .......................... 2009 1 0201947

(51) Int. Cl.
*H01L 29/732* (2006.01)
*H01L 21/8228* (2006.01)

(52) U.S. Cl.
USPC .... 257/511; 257/517; 257/574; 257/E29.185; 438/322; 438/359; 438/370

(58) Field of Classification Search
CPC .................................................. H01L 29/7302
USPC ................... 257/511, 512, E29.185
See application file for complete search history.

(56) References Cited

U.S. PATENT DOCUMENTS

| 4,339,767 | A  | * | 7/1982 | Horng et al. ................. 257/588 |
| 5,175,607 | A  | * | 12/1992 | Ikeda ............................. 257/511 |
| 6,420,771 | B2 | * | 7/2002 | Gregory ........................ 257/517 |
| 7,592,648 | B2 | * | 9/2009 | Bottner et al. ................ 257/197 |
| 2005/0250289 | A1 | * | 11/2005 | Babcock et al. ............. 438/309 |
| 2009/0203184 | A1 | * | 8/2009 | Magnee et al. .............. 438/369 |
| 2012/0139056 | A1 | * | 6/2012 | Wallner et al. ............... 257/378 |

* cited by examiner

*Primary Examiner* — Stephen W Smoot
(74) *Attorney, Agent, or Firm* — Ming Chow; Sinorica, LLC

(57) ABSTRACT

A parasitic vertical PNP bipolar transistor in BiCMOS process comprises a collector, a base and an emitter. The collector is formed by active region with p-type ion implanting layer (P type well in NMOS). It connects a P-type conductive region, which formed in the bottom region of shallow trench isolation (STI). The collector terminal connection is through the P-type buried layer and the adjacent active region. The base is formed by N type ion implanting layer above the collector which shares a N-type lightly doped drain (NLDD) implanting of NMOS. Its connection is through the N-type poly on the base region. The emitter is formed by the P-type epitaxy layer on the base region with heavy p-type doped, and connected by the extrinsic base region of NPN bipolar transistor device. This invention also includes the fabrication method of this parasitic vertical PNP bipolar transistor in BiCMOS process. And this PNP bipolar transistor can be used as the I/O (input/output) device in high speed, high current and power gain BiCMOS circuits. It also provides a device option with low cost.

12 Claims, 10 Drawing Sheets

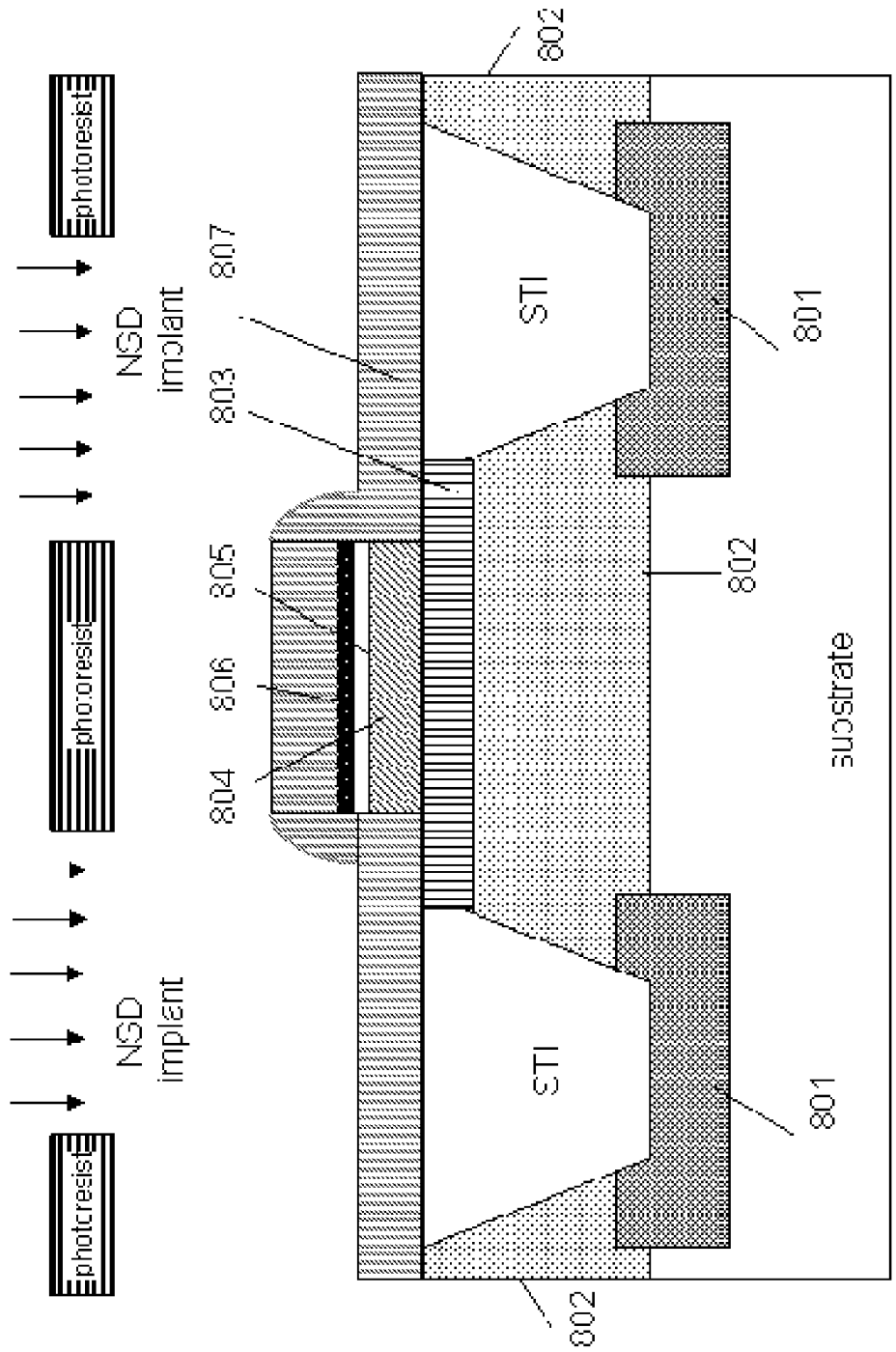

PARASITIC VERTICAL PNP BIPOLAR TRANSISTOR AND ITS FABRICATION METHOD IN BICMOS PROCESS

The current application claims a foreign priority to the application of China 200910201947.8 filed on Dec. 15, 2009.

FIELD OF THE INVENTION

This invention relates generally to semiconductor devices fabrication in integrated circuits. More particularly it relates to a parasitic vertical PNP bipolar transistor design in BiCMOS process, and it also relates to the fabrication of the vertical PNP bipolar transistor in BiCMOS process.

BACKGROUND OF THE INVENTION

Currently the NPN bipolar transistor in BiCMOS process usually uses heavily doped collector buried layer to reduce the collector resistance. This process also need n-type high dose and high energy implanting (above 1e15 cm$^{-2}$) to realize collector buried layer connection and to form collector pickup. The epitaxy layer on the collector buried layer forms the middle or low doped collector. The p-type doped silicon epitaxy forms the base and the heavy doped N-type poly silicon forms the emitter, then the fabrication of the bipolar is finished.

SUMMARY OF THE INVENTION

This invention provides a parasitic vertical PNP in the BiCMOS process which can be used as the high speed, high current and power gain JO (input/output) device and a device option for circuit design. This invention also provides the fabrication method of this parasitic vertical PNP bipolar transistor in BiCMOS process which without additional process and it also reduces the fabrication cost.

To solve the above technical problem, this invention supplies a parasitic vertical PNP bipolar transistor. The active region of this parasitic vertical PNP bipolar transistor is isolated by shallow trench isolation (STI) process. The device comprises:

A collector, which is formed by a p-type ion implanting layer in active region. The P-type ion implantation is shared with the P type well implant of the CMOS, contains anti-punch through implant and Vt implant. This p-type layer connects the p-type buried layer which formed by the P type ion implanting around the collector region in the bottom of shallow trench isolation (STI). The p-type ion implanting dose range is 1e14~1e16 cm$^{-2}$, energy is lower than 15 Kev, and the implant impurity is boron BF2 or Indium.

The P type conductive region is connected with the second active region, which is isolated with the first active region by the shallow trench isolation (STI) region with P type ion implantation. And it is connected to the contact metal and forms the collector terminal finally by the second active region with P type ion implantation.

A base, which is formed by a n-type ion implanting layer on the above mentioned collector region and collected with the collector region. The N-type ion implant of the base region is share with the N-type lightly doped drain (NLDD) implant of the NMOS, the implant impurity is phosphorus or arsenic, the energy is range is 1-100 Kev, the dose range is 1e11-1e15 cm-2, the implant depth and dose can fit the NMOS performance.

An emitter, which is formed by a epitaxy layer on above mentioned base region. The doping method and epitaxy method is same as the method of forming the base of NPN bipolar transistor. The thickness is less than 5000 Å. The implant species can be boron, and the boron peak concentration range is 1e17-1e20 cm$^{-2}$, the thickness and ion distribution is determined by the bipolar performance. It connects to the contact metal and forms the emitter terminal.

The base is connected by the above N-type heavily doped poly silicon, and It connects to the contact metal and forms the base terminal. The method of forming the heavily doped poly silicon above the base is: First etch or over-etch or thinner the p-type epitaxy layer in the base connection region, then deposit a n-type in-situ doped or updoped poly, and then heavily dope the N plus source drain implant, the impurity diffuse fast at high temperature, and distribute the whole poly silicon, which connects the base region.

The fabrication method of this parasitic vertical PNP bipolar transistor in BiCMOS process comprise:

active region and shallow trench isolation (STI) are formed on a silicon substrate;

the p-type buried layer connecting with collector region is formed by p-type implant on the shallow trench isolation (STI) bottom with dose range 1e14~1e16 cm$^{-2}$, the energy is less than 15 Kev, the implant species is boron, BF2 or Indium.

field oxide filling on shallow trench isolation (STI);

the collector is formed by p-type ion implanting, which is shared by the P type well implant condition of MOSFET and following the rapid thermal anneal (RTA) process to diffuse the p-type buried layer to make the two regions connected;

the base region is formed by a n-type ion implanting above the mentioned collector region, which is shared by the N-type lightly doped drain (NLDD) implant of the NMOS, the implant impurity is phosphorus or arsenic, the energy is range is 1-100 Kev, the dose range is 1e11-1e15 cm$^{-2}$, the implant depth and dose can fit the NMOS performance.

the emitter is formed by a epitaxy layer on above mentioned base region, which is shared by the base epitaxy method with the NPN bipolar transistor. The thickness is less than 5000 Å, The implant species can be boron, and the boron peak concentration range is 1e17-1e20 cm$^{-2}$, the thickness and ion distribution is determined by the bipolar performance.

the base region is connected with the N-type heavily doped poly silicon. The method is: First etch or over-etch or thinner the p-type epitaxy layer in the base connection region, then deposit a n-type in-situ doped or updoped poly, and then heavily dope the N plus source drain implant, the impurity diffuse fast at high temperature, and distribute the whole poly silicon, which connects the base region.

the contact metal connects collector, base and emitter.

This parasitic vertical PNP bipolar transistor in BiCMOS process has a current gain high than 15 and good frequency characteristics which can be used as the high speed and high current gain IO (input/output) circuit and supplies one more choice for circuit design. As the fabrication method of this parasitic transistor adapts the buried layer, N-type lightly doped drain (NLDD) implanting, base eptiaxy layer of NPN, source drain poly and N plus source drain implanting in BiCMOS process without additional process and cost. This invention also avoids use the buried layer, collector epitaxy and deep trench isolation process in traditional BiCMOS process and drive the cost low more.

BRIEF DESCRIPTION OF THE DRAWINGS

The foregoing and the object, features, and advantages of the invention will be apparent from the following detailed description of the invention, as illustrated in the accompanying drawings, in which:

FIG. 2A to FIG. 2G is the cross section the parasitic vertical PNP bipolar transistor in BiCMOS process at different process steps;

DETAILED DESCRIPTION OF THE INVENTION

Figure 1:
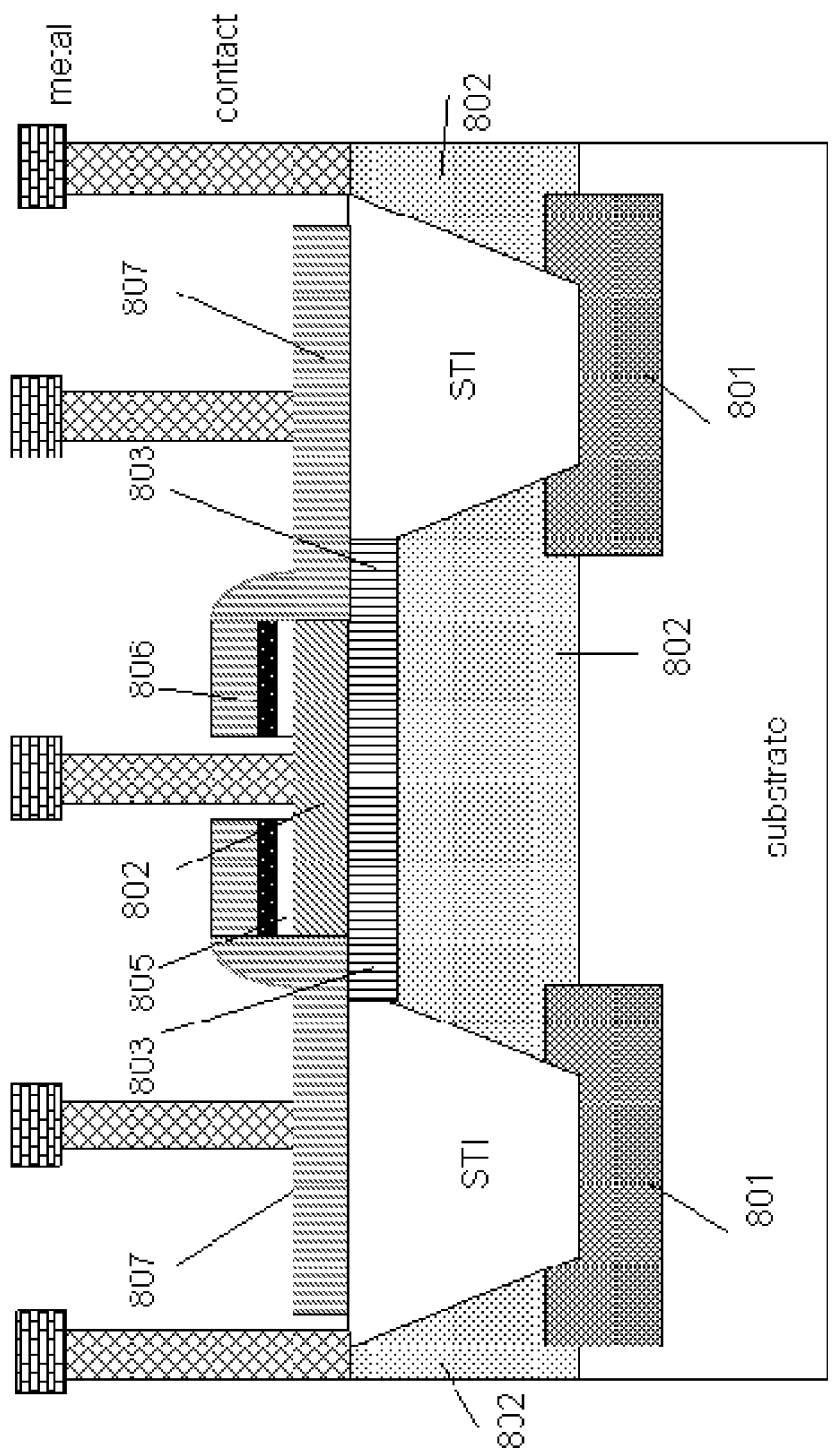
FIG. 1 is the cross section of the parasitic vertical PNP bipolar transistor in BiCMOS process of this invention.

FIG. 1 illustrates the parasitic vertical PNP bipolar transistor in BiCMOS process of this invention. The active region is isolated by shallow trench isolation (STI) field oxide as showed in FIG. 1. The PNP bipolar transistor structure comprises a collector 802, a base 803 and an emitter 804.

The collector 802 is formed by the p-type ion implanting layer in active region, which is shared with the P type well implant of MOSFET. Contains anti-punch through implant and Vt implant.

The bottom of the collector region 802 connects a p-type buried layer 801, which is formed by P-type ion implanting surrounding the collector region in the bottom of shallow trench isolation (STI). the dose range of the p-type ion implanting is 1e14~1e16 cm$^{-2}$, energy is lower than 15 Kev, and the ion impurity is boron, BF2 or Indium. The P type conductive region 801 is connected with the second active region, which is isolated with the first active region by the shallow trench isolation (STI) region with P type ion implantation. And it is connected to the contact metal and forms the collector terminal 802 finally by the second active region with P type ion implantation layer 802.

The base region 803 is formed by n-type implanting region which is on the collector region 802. This n-type ion implantation to form base 803 is shared with the N-type lightly doped drain (NLDD) implant condition of NMOS. The implanting species is phosphors or arsenic, and the implant depth and dose can fit the NMOS performance.

The emitter region 804, is formed by the P-type epitaxy layer above the base region 803, the implant species is boron, and the thickness and ion distribution is determined by the bipolar performance, and connected to the contact metal.

The base region 803 is connected by the above N-type heavily doped poly silicon 807, and the poly silicon 807 connects to the contact metal and forms the base terminal 803. The method to connect the base region 803 and the heavily doped poly silicon 807 is: First etch or over-etch or thinner the p-type epitaxy layer in the base connection region, while the emitter region is protected by the oxide 805 and nitride 806 film. then deposit a n-type in-situ doped or updoped poly, and then heavily dope the N plus source drain implant, the impurity in poly diffuse fast at high temperature, and distribute the whole poly silicon, which connects the base region.

Figure 2A:
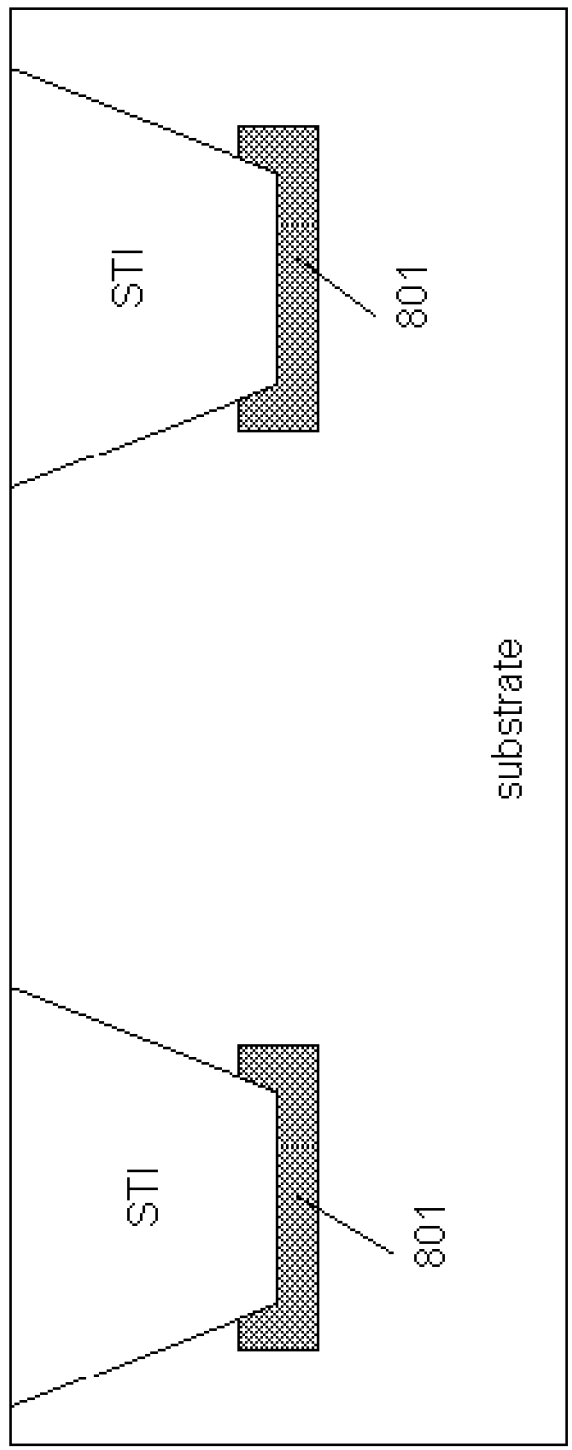

The illustration of FIG. 2A to FIG. 2G is cross section structure of the new invented parasitic vertical bipolar transistor in BiCMOS process at different process step during fabrication, it comprises:

Process step 1, as illustrated by FIG. 2A, lightly doped p-type substrate is selected. shallow trench isolation (STI) is used for isolation. After the shallow trench isolation (STI) etch, the p-type buried layer 801 is formed by ion implanting in the bottom of shallow trench isolation (STI) with the implant dose range 1e14~1e16 cm$^{-2}$, energy less than 15 Kev.

The P-burier layer is for low resistance collect connection of the parasitic vertical bipolar transistor.

Figure 2B:
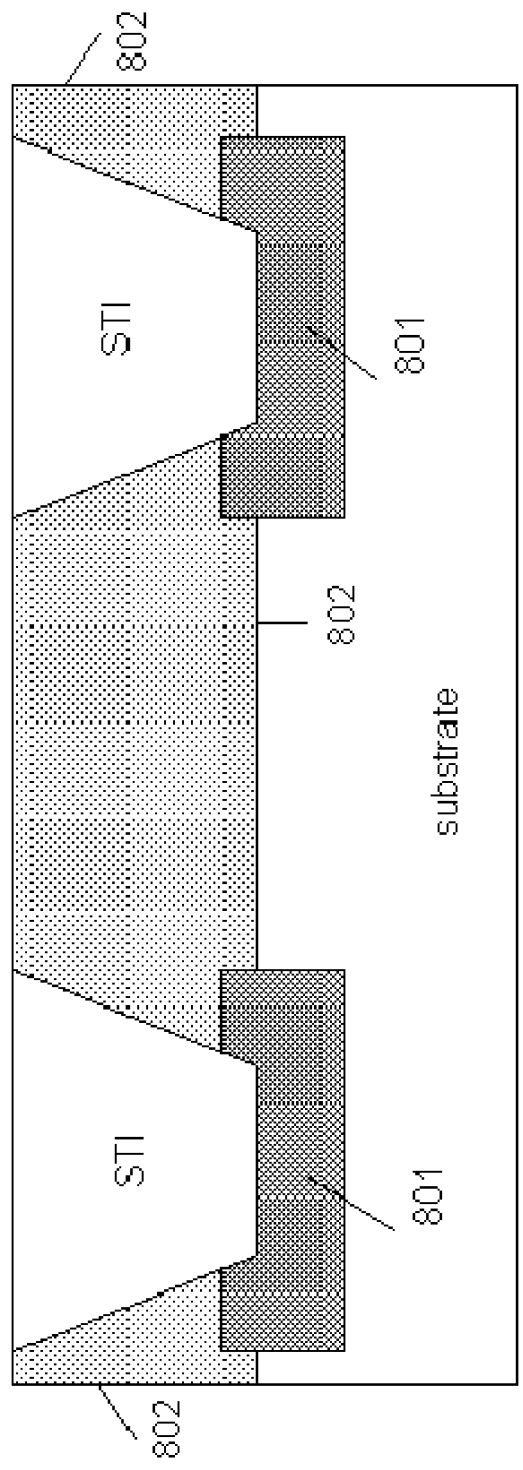

Process step 2, as illustrated by FIG. 2B, after the formation of shallow trench isolation (STI) and burier layer, the collector region 802 is formed by the p-type ion implanting layer in the first active region. which is shared with the P type well implant of MOSFET of the BiCMOS process, contains anti-punch through implant and Vt implant. Collector pick up region 802 which is isolated with the collector region by the shallow trench isolation (STI) region is also formed Use rapid thermal anneal (RTA) process to make the p-type layer vertically and laterally diffused into active regions 202 and connects the collector region and collector pick up region, it is useful for reducing the collector link resistance.

Figure 2C:
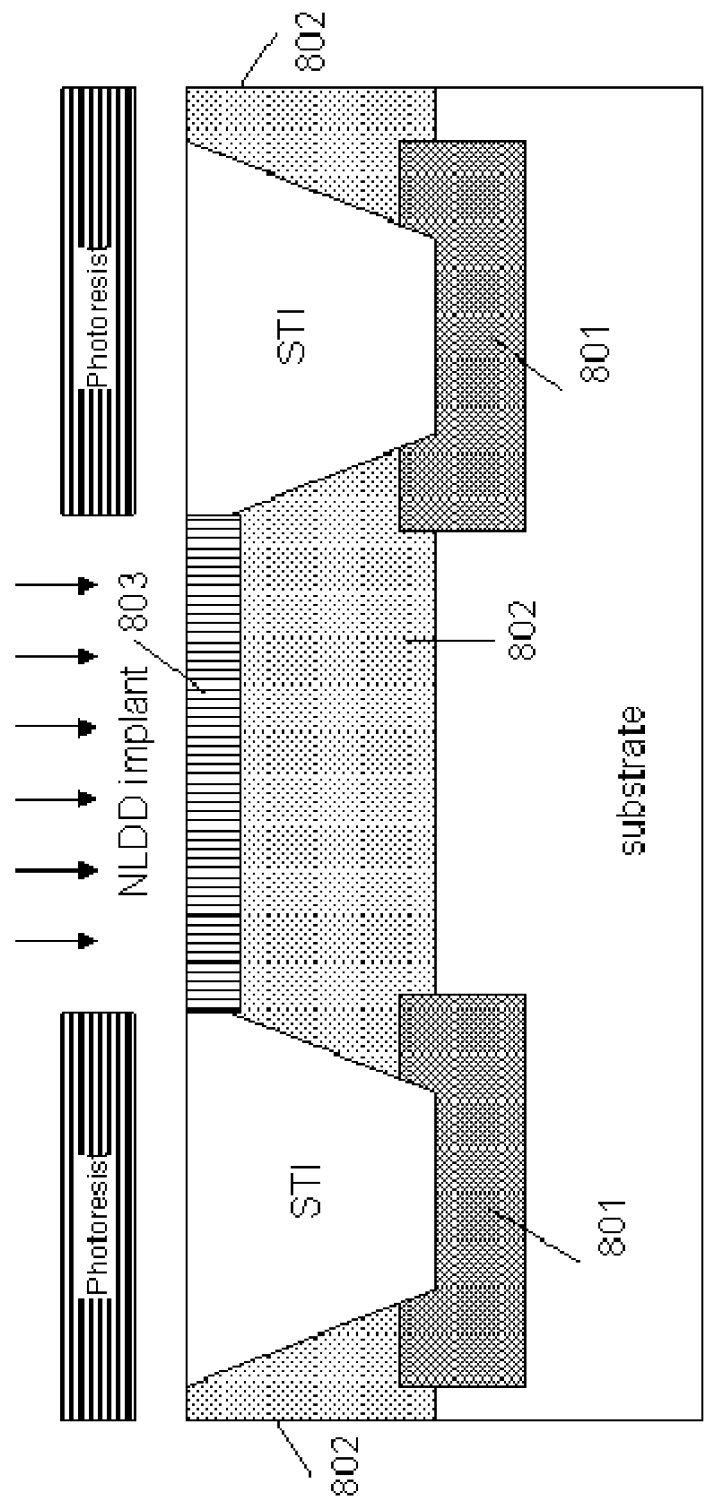

Process step 3, as illustrated by FIG. 2C, base region of the parasitic vertical PNP bipolar transistor 803 is formed by N-type lightly doped drain (NLDD) implanting on the collector region 802. Implanting area is defined by suitable photo resist.

Figure 2D:
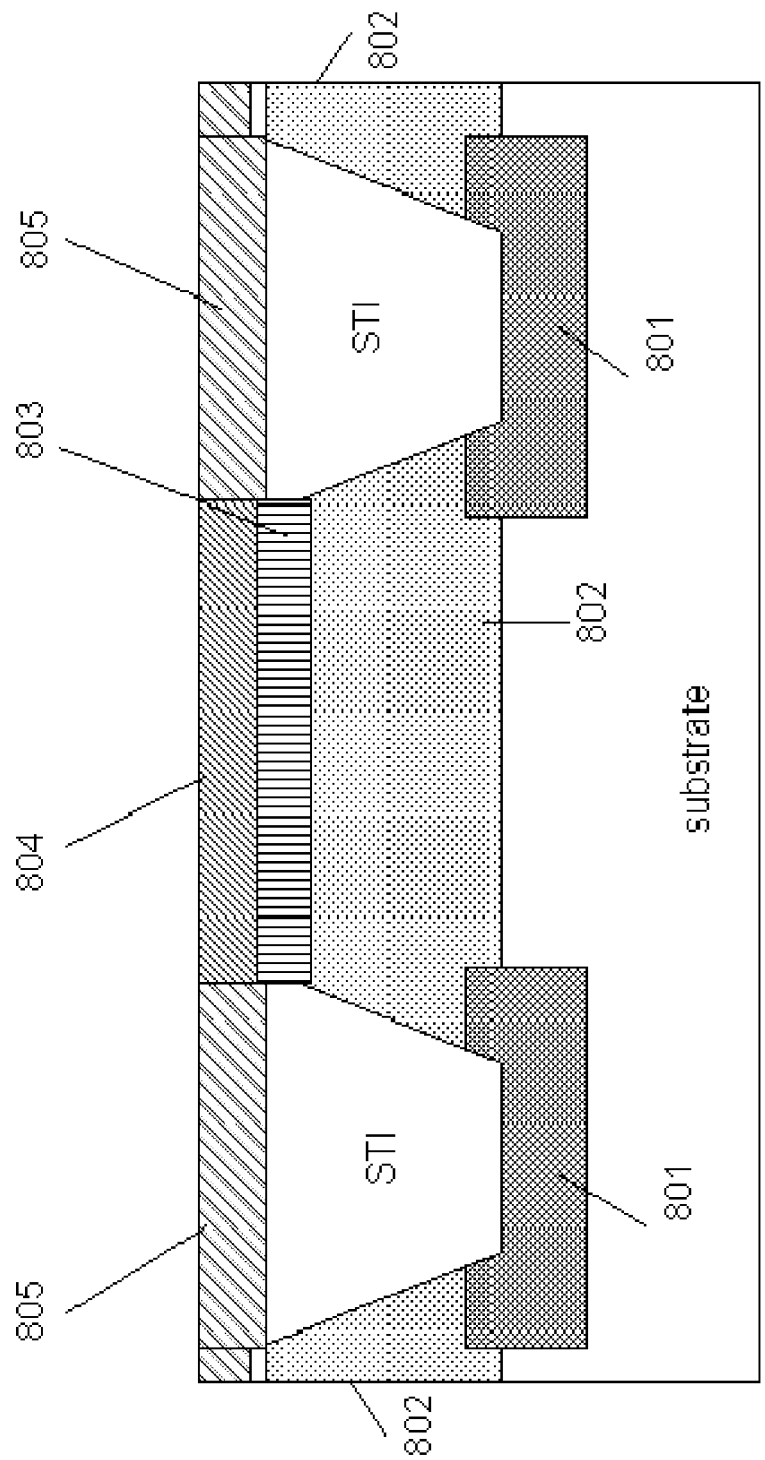

Process step 4, as illustrated by FIG. 2D, firstly a oxide film and poly silicon film are deposited (this polysilicon film is optional). And the films are etched away on the base region. After the etch and clean, a p-type epitaxy is formed, which is intrinsic doped with boron. This epitaxy layer will form single crystal 804 on silicon region and form polysilicon 805 on oxide or polysilicon region.

Figure 2E:
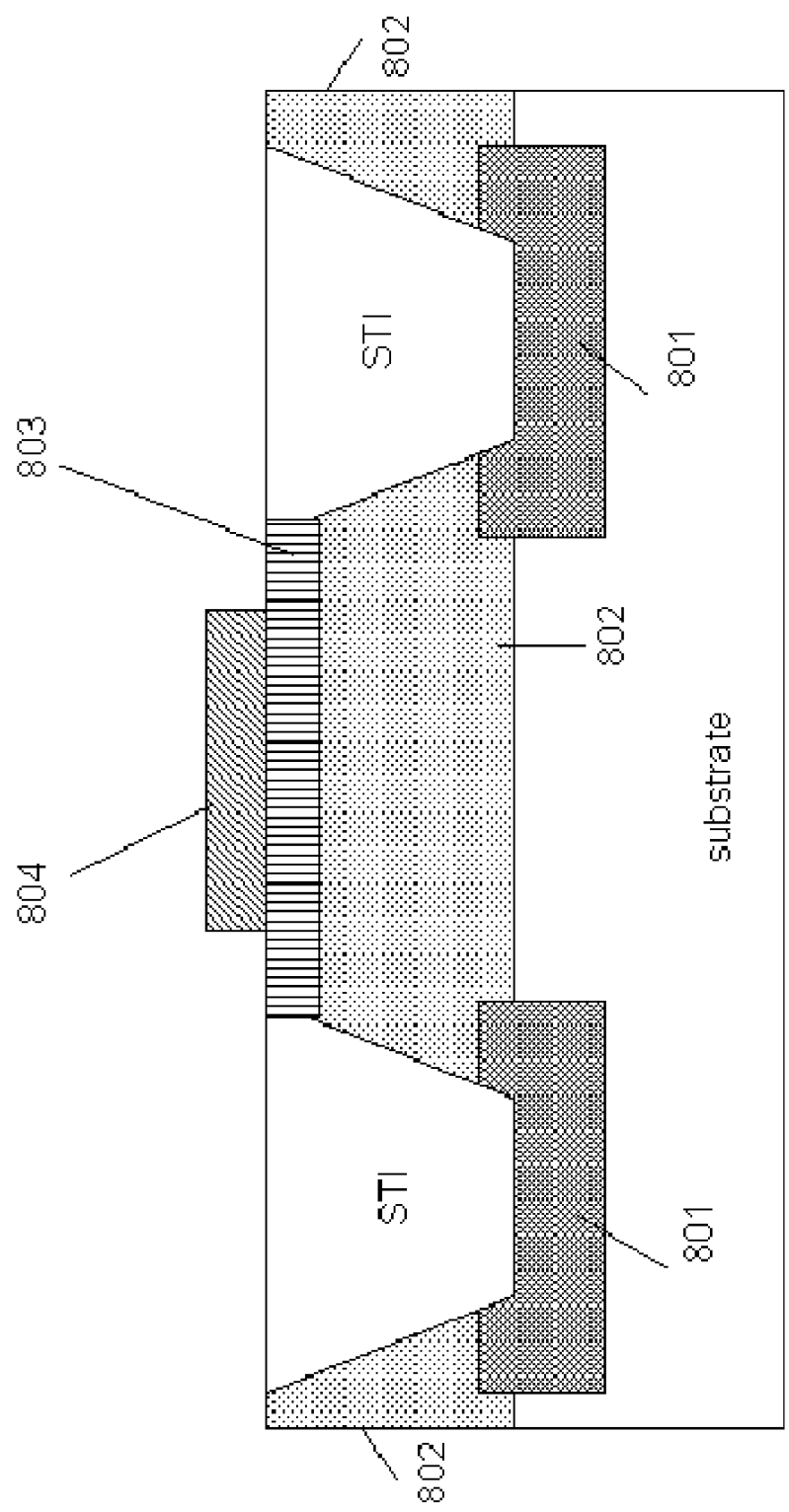

Process step 5, as illustrated by FIG. 2E, First etch or over-etch or thinner the p-type epitaxy layer in the base connection region 803, the remaining region is single crystal of the emitter region 804, the etch thickness is optimized by process, and to make sure the base 803 connection.

Process step 6, as illustrated by FIG. 2F, a 20 nm thickness oxide film 805 and a 30 nm thickness nitride film 806 are deposited. Then etch this film away on the region except the emitter region 804, which is used to block the emitter region. Then deposit the source drain poly silicon, the poly silicon should be in-situ doped by arsenic or phorphorus, or un-doped but use N-type implant to reduce the resistance, or both are used. And the implant region is defined by photo resist. If just for the new invented parasitic vertical PNP bipolar transistor, this implantation also can be blank implanting.

Figure 2G:
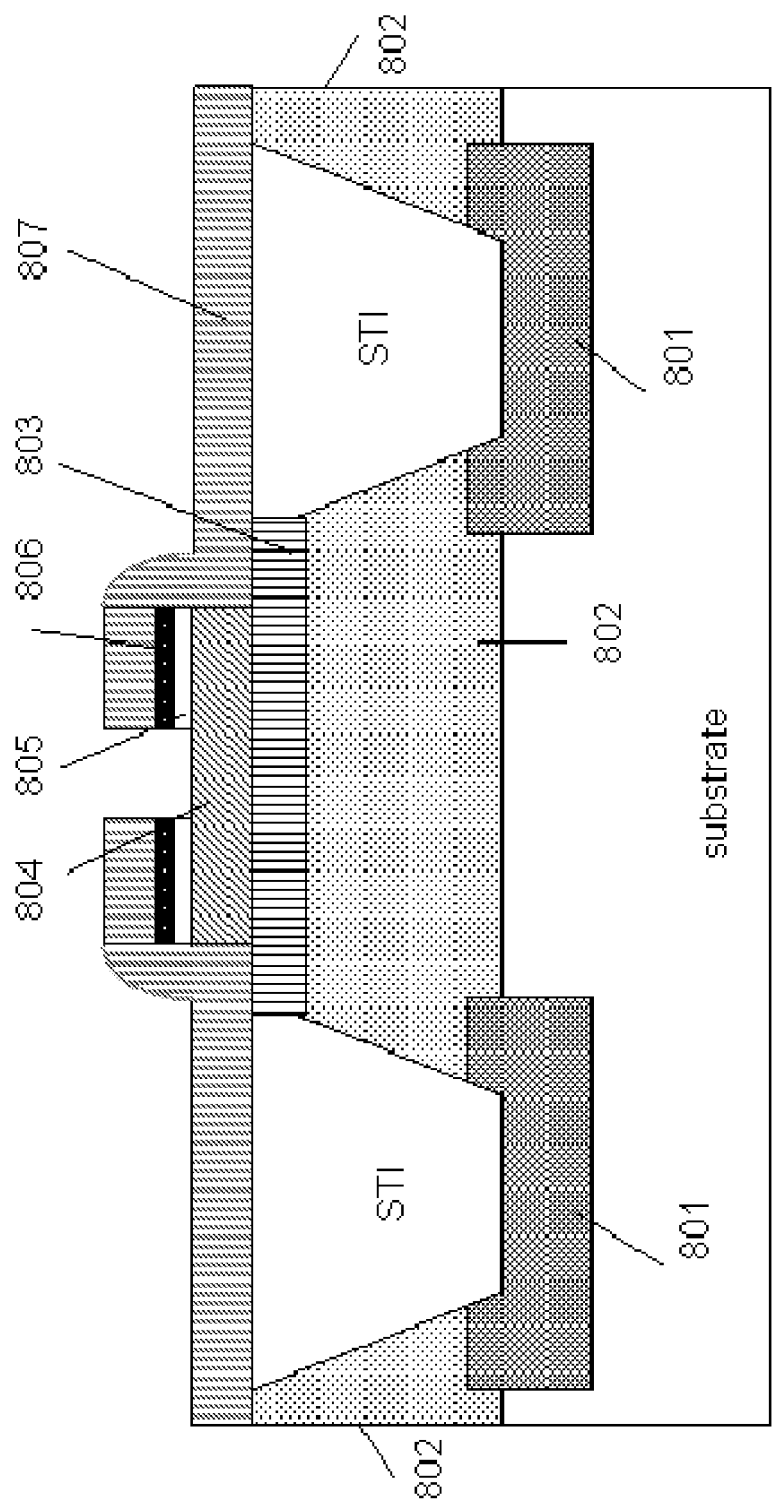

Process step 7, as illustrated by FIG. 2G, first etch the poly silicon and dielectric film (nitride 806 and oxide 805), open the emitter region 804 of the parasitic vertical PNP bipolar transistor, while keep the dielectric film surround the emitter region 804, which isolate the poly silicon and emitter, while keep the poly silicon 807 for base connecting. Meanwhile the rapid thermal anneal (RTA) process activate the impurity in the poly 807 for both emitter region 804 and base region 803.

Process step 8, as illustrated by FIG. 1, the whole parasitic vertical PNP bipolar transistor is integrated through the contact and metal process on emitter region, base region and the collector region.

Figure 3A:
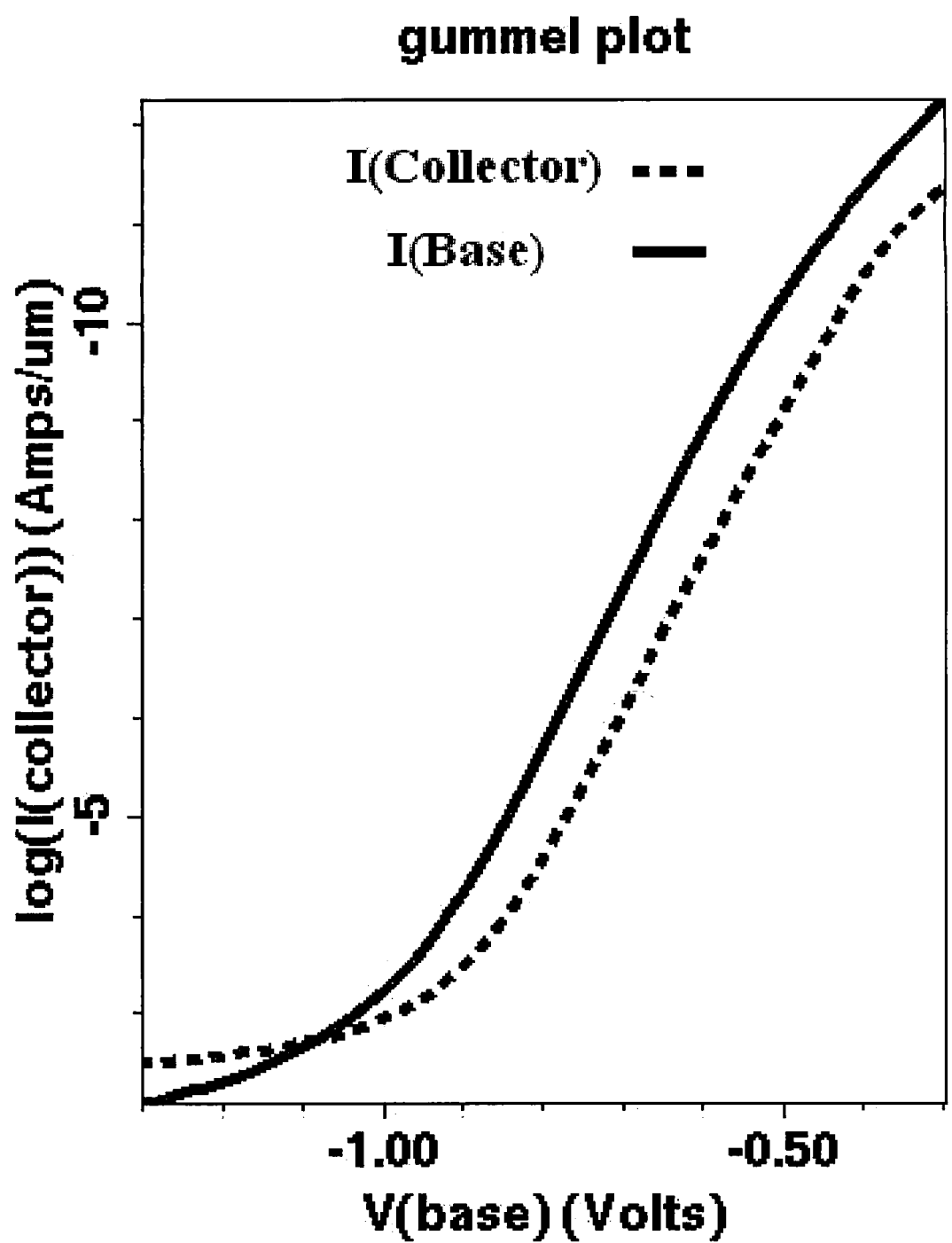
FIG. 3A is the Gummel plot of this parasitic vertical PNP bipolar transistor in BiCMOS process from TCAD simulation.
Figure 3B:
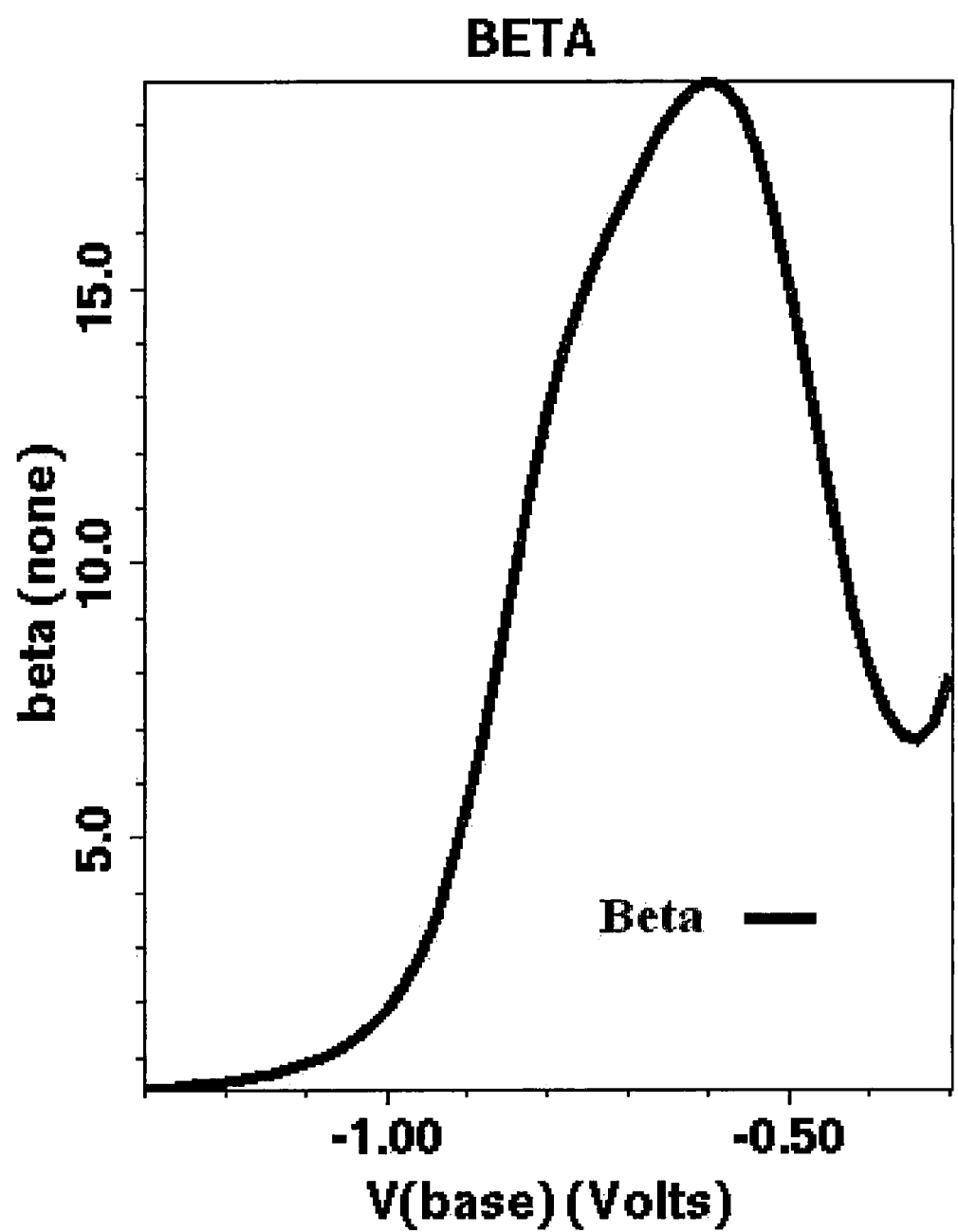
FIG. 3B is the current gain (Beta) of this parasitic vertical PNP bipolar transistor in BiCMOS process from TCAD simulation.

As illustrated by FIG. 3A and FIG. 3B, the Gummel plot and current gain (Beta) curves of this parasitic vertical PNP bipolar transistor are got by TCAD simulation. In the invention example, the emitter is base epitaxy layer of SiGe HBT, and the doped impurity is germanium and born. Upon the simulation result, it shows that heavy p-type doping of buried layer is effective to reduce collector connecting resistance; the N-type base region is connected by the source drain poly, and the emitter-base junction is well formed by the epitaxy and the N-type lightly doped drain (NLDD) region of the CMOS. The maximum current gain can reach 16.

Above illustration is detailed transistor information and fabrication method of this invention, but this invention is not limited by those illustration. Other modification and improvement based on the same mechanism of this invention are protected by this invention.

The invention claimed is:

1. A parasitic vertical PNP bipolar transistor in a BiCMOS process with shallow trench isolation (STI) comprises:
    a collector being formed by a first active region with p-type ion implantation, which is a P type well of NMOS in the CMOS process;
    a p-type conductive layer being connected to a bottom of the collector;
    the p-type conductive layer is a p-type buried layer which is formed by a p-type ion implanting layer in a bottom of the shallow trench isolation (STI) around the collector;
    the p-type buried layer is connected with an adjacent second active region;
    the first active region and the second active region is connected through the p-type buried layer in the bottom of the shallow trench isolation (STI);
    the second active region with a p-type implantation layer is connected with a contact metal to form the collector;
    a base is formed on the collector by an n-type ion implanting layer and the n-type ion implanting layer is an N-type lightly doped drain (NLDD) implanting of NMOS;
    an emitter is formed by a p-type epitaxy layer above the base wherein the emitter is a base epitaxy layer of NPN transistor, and the emitter is connected by the contact metal;
    the base is connected by a heavily doped N-type polysilicon; and
    the base is connected by the contact metal above the heavily doped N-type poly-silicon.

2. The parasitic vertical PNP bipolar transistor in a BiCMOS process of claim 1 comprises,
    a p-type ion implantation layer to form the collector is the same as a P type well implant condition of MOSFET, which contains anti-punch through implanting and Vt implanting.

3. The parasitic vertical PNP bipolar transistor in BiCMOS process of claim 1 comprises, the p-type conductive layer in the collector region is adapted by the p-type ion implantation with a dose 1e14~1e16 cm$^{-2}$, energy is lower than 15 Kev, and implant impurity is Boron, BF2 or Indium.

4. The parasitic vertical PNP bipolar transistor in BiCMOS process of claim 1, comprises, the n-type ion implantation condition to form the base is the same as the N-type lightly doped drain (NLDD) implant condition of NMOS;
    an implanting species is phosphorus or arsenic, energy range 1~100 keV, and dose range 1e11~1e15 cm$^{-2}$.

5. The parasitic vertical PNP bipolar transistor in BiCMOS process of claim 1 comprises, the p-type epitaxy process on base region is shared with the base process of NPN bipolar transistor, and the thickness is less than 5000 Å; and it is intrinsic doped with boron, the peak concentration is 1e17~1e20 cm$^{-3}$.

6. The parasitic vertical PNP bipolar transistor in BiCMOS process of claim 1 comprises,
    the N-type heavily doped polysilicon above the base is formed on the p-type epitaxy layer, and the method to form the N-type heavily doped polysilicon is first etch or over-etch or thinner the p-type epitaxy layer in a base connection region, then deposit an n-type in-situ doped or updoped polysilicon, and then heavily dope N+ source drain implant, impurities in polysilicon diffuse fast at high temperature, and distribute the whole polysilicon, which connects the base connection region.

7. A fabrication method of the parasitic vertical PNP bipolar transistor in BiCMOS process as claimed in claim 1 comprises,
    forming an active region and a shallow trench isolation (STI) on a silicon substrate;
    forming the p-type buried layer connecting with the collector region by the p-type implant on the shallow trench isolation (STI) bottom;
    filling the fixed oxide on shallow trench isolation (STI);
    forming the collector by a p-type ion implanting in the active region;
    forming the base region by an n-type ion implanting above the collector region;
    forming the emitter by the P-type epitaxy layer above the base region;
    connecting the base region with the heavily doped poly silicon;
    connecting the contact metal with the collector, base and emitter.

8. The fabrication method of parasitic vertical PNP bipolar transistor in BiCMOS process of claim 7 comprises, the p-type ion implantation to form the collector is shared with the pwell implant condition of MOSFET, which contains anti-punch through implanting and Vt implanting.

9. The fabrication method of parasitic vertical PNP bipolar transistor in BiCMOS process of claim 7, the dose range of the p-type barrier layer of the collector region is 1e14~1e16 cm$^{-2}$, the energy is less than 15 Kev, the implant impurity is boron, BF2 or indium.

10. The fabrication method of parasitic vertical PNP bipolar transistor in BiCMOS process of claim 7, the n-type ion implantation to form base is shared with the N-type lightly doped drain (NLDD) implant condition of NMOS, the implanting species is phosphorus or arsenic, energy range 1~100 keV and dose range 1e11~1e15 cm$^{-2}$; and the implant depth and dose can fit the NMOS performance.

11. The fabrication method of parasitic vertical PNP bipolar transistor in BiCMOS process of claim 7, p-type epitaxy layer to form the emitter is shared with the base epitaxy of NPN bipolar transistor; the thickness of the p-type epitaxy layer is less than 5000 Å, the intrinsic doping, thickness and doping profile of the p-type epitaxy layer are following the NPN process; the implant species can be boron, the impurity concentration peak range 1e17~1e20 cm$^{-3}$.

12. The fabrication method of parasitic vertical PNP bipolar transistor in BiCMOS process of claim 7, the method to connect the base region and the heavily doped poly silicon is: first etch or over-etch or thinner the p-type epitaxy layer in the base connection region, then deposit an n-type in-situ doped or updoped poly silicon, and then heavily dope the N plus source drain implant, the impurity diffuse fast at high temperature, and distribute the whole poly silicon, which connects the base region.

* * * * *